United States Patent
Bader et al.

(10) Patent No.: US 7,425,237 B2
(45) Date of Patent: Sep. 16, 2008

(54) METHOD FOR DEPOSITING A MATERIAL ON A SUBSTRATE WAFER

(75) Inventors: Stefan Bader, Eilsbrunn (DE);
Hans-Jurgen Lugauer, Sinzing (DE);
Volker Haerle, Laaber (DE); Berthold Hahn, Hemau (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 314 days.

(21) Appl. No.: 10/696,882

(22) Filed: Oct. 30, 2003

(65) Prior Publication Data
US 2004/0152312 A1 Aug. 5, 2004

(30) Foreign Application Priority Data
Oct. 31, 2002 (DE) ................. 102 50 915

(51) Int. Cl.
*C30B 23/00* (2006.01)
(52) U.S. Cl. ................. 117/90; 117/94; 117/104
(58) Field of Classification Search .......... 117/90, 117/94, 104
See application file for complete search history.

(56) References Cited

U.S. PATENT DOCUMENTS

| | | | |
|---|---|---|---|
| 5,771,110 A | | 6/1998 | Hirano et al. |
| 6,242,764 B1 * | | 6/2001 | Ohba et al. ................. 257/190 |
| 6,447,604 B1 | | 9/2002 | Flynn et al. |
| 6,730,939 B2 * | | 5/2004 | Eisert et al. ................. 257/98 |
| 6,927,155 B2 * | | 8/2005 | Lugauer et al. ............. 438/604 |
| 2002/0028314 A1 | | 3/2002 | Tischler et al. |
| 2003/0057434 A1 * | | 3/2003 | Hata et al. .................. 257/103 |

FOREIGN PATENT DOCUMENTS

EP  1 143 047 A1  9/2000
TW  447047  7/2001

OTHER PUBLICATIONS

Mayer et al, Electronic Materials Science: For Integrated Circuits in Si and GaAs, MacMillan Publishing, 1990, p. 433.*
Wikipedia entry on Metalorganic Vapour Phase Deposition.*
Römpp Lexikon Chemie, 10$^{th}$ Ed., vol. A6, pp. 4914-4915.
German Examination Report dated Aug. 10, 2006 issued for the corresponding German Application No. 102 50 915.8-43.

* cited by examiner

*Primary Examiner*—Robert M. Kunemund
*Assistant Examiner*—G. Nagesh Rao
(74) *Attorney, Agent, or Firm*—Cohen Pontani Lieberman & Pavane LLP

(57) ABSTRACT

The deposition of material (3) on a growth area (4) may be highly temperature-sensitive. In order to reduce temperature inhomogeneities on the growth area (4) of a substrate wafer (1), a thermal radiation absorption layer (2) is applied on a rear side (5) of the substrate wafer (1) lying opposite to the growth area (4). The thermal radiation absorption layer (2) exhibits good radiation absorption in the spectral range of a heating source. Since the deposition of semiconductor materials, in particular AllnGaN, may lead to (depending on the deposition temperature) different emission wavelengths of the deposited material, the use of a thermal radiation absorption layer (2) may produce a narrower emission wavelength distribution of the deposited material (3).

13 Claims, 1 Drawing Sheet

METHOD FOR DEPOSITING A MATERIAL ON A SUBSTRATE WAFER

This patent application claims the priority of German patent application 102 50 915.8-33, the disclosure content of which is hereby incorporated by reference.

FIELD OF THE INVENTION

The invention relates to a method for depositing a material on a substrate wafer, in particular a semiconductor material on an SiC-based substrate wafer. It is concerned in particular with a method in which the material to be deposited is temperature-sensitive.

BACKGROUND OF THE INVENTION

During epitaxy on SiC substrate wafers, the heating of the substrate wafer to the deposition temperature is principally effected by contact and heat convection. Since the substrate wafer usually bends during the heating process, the locations at which contact is kept with the heating source are heated to a greater extent than the locations which are no longer in contact with the heating source on account of the curvature. This leads to a non-uniform heating of the substrate wafer. Since the deposition of some materials, in particular semiconductor materials, is extremely temperature-sensitive, temperature inhomogeneities on the growth area lead to large variations in the properties of the deposited semiconductor material. By way of example, a temperature difference of 1° C. during the epitaxy of AlInGaN suffices to cause considerable variations in the emission wavelength of the deposited AlInGaN. Such wide variation of the emission wavelength of the semiconductor material then also impairs the uniformity and therefore the quality of the finished components.

In contrast to this, it is possible to achieve a more uniform temperature on the growth area of the substrate wafer by heating using thermal radiation. In the case of an SiC substrate wafer, however, thermal radiation cannot be used because SiC is transparent in the entire spectral range above about 400 nm and is therefore unable to absorb radiation in this range.

In order to improve the heat input into a substrate wafer during MBE (molecular beam epitaxy), it is known to apply metal layers on the rear side of the substrate wafer, which can absorb the thermal radiation better than the substrate wafer. This method leads to a narrower temperature distribution on the substrate wafer and thus to less variation in the emission wavelength of the deposited, temperature-sensitive semiconductor material.

In MOVPE (metal organic vapour phase epitaxy), such a metal layer has not been used heretofore because an additional layer on the rear side of the substrate wafer possibly leads to contaminants in the reactive gas space. Therefore, at the present time there are no measures known for MOVPE which enable a uniform heating of the substrate wafer in particular of an SiC-based substrate wafer.

SUMMARY OF THE INVENTION

It is an object of the present invention to specify a method of the type mentioned in the introduction which, during the deposition of a material, allows a temperature distribution that is as narrow as possible on the growth area of a substrate wafer.

This and other objects are attained in accordance with one aspect of the invention directed to a method for depositing a material on a substrate wafer having the following method steps. Providing a substrate wafer, which has a growth area intended for a later material deposition. Before the deposition of a material on the growth area by means of MOVPE, applying a thermal radiation absorption layer, which exhibits a good absorption of thermal radiation on the rear side of the substrate wafer, which faces away from the growth area. Heating the substrate wafer to the deposition temperature. Depositing a material onto the growth area of the substrate wafer by an MOVPE method.

In a preferred embodiment, a material which, during the deposition, does not react with other materials present in the reactor is selected for the thermal radiation absorption layer. The coating material preferably exhibits inert behaviour during the deposition. Therefore, the coating material expediently has the following properties:

It does not react with the reactants or precursors of the material to be deposited, in particular not during the deposition, It does not react with a carrier medium which can be used during the deposition, e.g. with a carrier gas which is used during an MOVPE method, and/or It does not react with other compounds present in the reactor space, including the reactor space materials, during the deposition.

A material which is chemically compatible with the process for the subsequent application of a contact and with the contact material itself is preferably used as the thermal radiation absorption layer. A contact is usually applied on the rear side of the substrate wafer. Such a compatible coating material is understood to be, inter alia, a material having the following properties:

The coating material, during a later contact-connecting process, does not form compounds which prevent the process or make the process more difficult, and/or The coating material, during the contact-connection, does not form compounds which adversely affect the finished electrical contact, e.g. which increase the electrical resistance of the contact.

In a further embodiment, the thermal radiation absorption layer features a semiconductor material. The deposition process of a thermal radiation absorption layer having semiconductor material is advantageously compatible with the rest of the method, i.e. the same apparatus can be used, and the deposition method and the rest of the method can be carried out under similar conditions.

In a further embodiment, a thermal radiation absorption layer made of doped silicon is expediently used. Such a thermal radiation absorption layer preferably has a doping of at least $1 \times 10^{19}$ cm$^{-3}$.

If highly doped silicon is used as the absorption layer, this layer advantageously need not be removed. It is also possible to apply the contact metallization to the rear side of the substrate and then the absorption layer to said contact metallization. If the contact metallization and the absorption layer are chemically compatible, this procedure ensures a good contact independent of the choice of the material of the absorption layer. In this case, the absorption layer may remain on the rear side (as long as it is electrically conductive).

In a further preferred embodiment, a substrate wafer which essentially comprises SiC or an SiC-based material is used. This is understood to be a substrate wafer which essentially has the properties of SiC, in particular high transparency to thermal radiation.

In a further embodiment, the material to be deposited comprises a semiconductor material, in particular a semiconductor having the composition $Al_xGa_yIn_{1-x-y}N$, where $0 \leq x+y \leq 1$, $0 \leq x \leq 1$, $0 \leq y \leq 1$.

BRIEF DESCRIPTION OF THE DRAWINGS

The invention is explained in more detail below using an exemplary embodiment in conjunction with FIGS. 1a to 1c.

DETAILED DESCRIPTION OF THE DRAWINGS

Identical or effectively identical elements are provided with the same reference symbols in the Figures. The thickness of the layers, in particular, is not illustrated to scale in the Figures in order to provide a better understanding.

Figure 1:
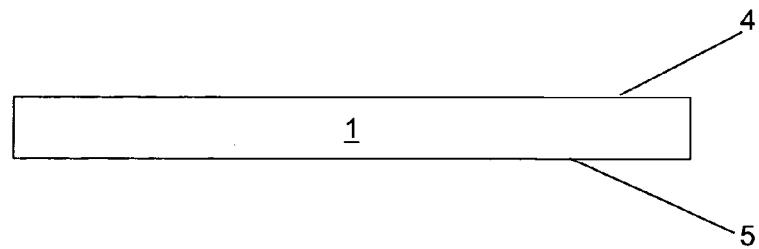
FIGS. 1a to 1c show diagrammatic sectional illustrations of some method steps of an exemplary embodiment of a method according to the invention.
Figure 1:
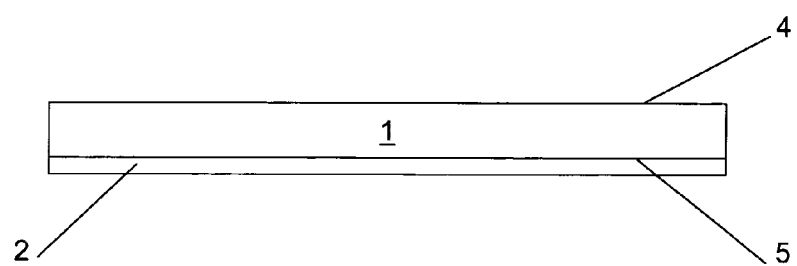
Figure 1:
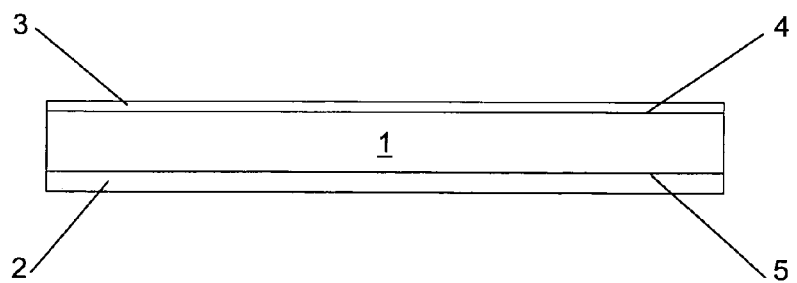

FIG. 1a shows a substrate wafer 1 having a growth area 4 and a rear side 5 lying opposite to the growth area 4. The substrate wafer 1 has the form of a slice, by way of example. Other forms are also conceivable. By way of example, the substrate wafer 1 is composed of SiC.

In FIG. 1b, a thermal radiation absorption layer 2 is applied on the rear side 5 of the substrate wafer 1. By way of example, the thermal radiation absorption layer 2 is applied by sputtering. It may have a thickness of between 10 nm and 20 µm. In this example, the thermal radiation absorption layer 2 has a thickness of 20 nm and in this case is composed of a very highly doped (e.g. $1 \times 10^{19}/cm^3$) silicon-based material. This layer is absorbent for the most part of the thermal radiation and thereby effects a homogeneous heating of the substrate wafer. The magnitude of the proportion of thermal radiation which is absorbed depends on the doping level of the silicon. In addition, a thermal radiation absorption layer 2 based on doped silicon forms only a low ohmic resistance for the contact that is to be applied later.

Other semiconductor materials and also non-semiconducting but preferably non-metallic materials or a mixture thereof may also be used as the thermal radiation absorption layer 2.

After the substrate wafer 1 has been heated to the deposition temperature, AlInGaN, for example, is deposited onto the growth area 4 of the substrate wafer 1 by an MOVPE method (see FIG. 1c). Corresponding investigations by the inventors have shown that a doped Si layer in the MOVPE reaction space does not disadvantageously influence the deposition process.

According to the invention, such a thermal radiation absorption layer 2 may also be used when a MBE method, CVD method (chemical vapour deposition) or another known deposition method is carried out for depositing the material 3. A narrow temperature distribution on the substrate wafer 1, which is achieved through the use of a thermal radiation absorption layer 2 on the rear side of the substrate wafer in conjunction with a radiation source, is not just restricted to an MOVPE method. Such a non-metallic and in particular semiconducting thermal radiation absorption layer 2 may also be used in other deposition methods in order to achieve better results through a more uniform heating and thus a narrower temperature distribution.

Other semiconductor materials and non-semiconducting materials may also advantageously be deposited by the method according to the invention. This applies particularly to materials whose properties vary depending on the deposition temperature used.

In investigations, the inventors have also ascertained that the conventional processes for the contact-connection of an SiC substrate wafer are compatible with a thermal radiation absorption layer made of doped silicon and can be used without special adaptation.

If, (preferably highly doped) silicon is used as the absorption layer, this layer need not be removed. It is also possible to apply the contact metallization to the rear side of the substrate and then the absorption layer to said contact metallization. If the contact metallization and the absorption layer are chemically compatible, this procedure ensures a good contact independent of the choice of the material of the absorption layer. In this case, the absorption layer may remain on the rear side (as long as it is electrically conductive).

The invention is not restricted by the description of the invention on the basis of the exemplary embodiments. Rather, the invention encompasses every new feature and every combination of features, which, in particular, includes any combination of features in the patent claims even if this combination is not explicitly specified in the patent claims.

We claim:

1. A method for depositing a material on a substrate wafer having the following method steps:
   (a) providing the substrate wafer, which has a growth area intended for a later material deposition;
   (b) affixing a thermal radiation absorption layer, which exhibits a good absorption of thermal radiation, on a rear side of the substrate wafer which faces away from the growth area;
   (c) heating the substrate wafer to a deposition temperature;
   (d) depositing a material onto the growth area of the substrate wafer by an MOVPE method;
   wherein the thermal radiation absorption layer is affixed to the substrate before the deposition of the material onto the growth area of the substrate wafer; and
   wherein the substrate wafer is heated by the thermal radiation absorption layer during MOVPE.

2. The method according to claim 1, in which the deposited material is a semiconductor material.

3. The method according to claim 1, in which the deposited material comprises at least one layer made of $Al_xGa_yIn_{1-x-y}N$, where $0 \leq x+y \leq 1$, $0 \leq x \leq 1$, $0 \leq y \leq 1$ apply.

4. The method according to claim 1, in which a substrate wafer is used which essentially comprises SiC or an SiC-based material.

5. The method according to claim 1, in which a material or a material mixture which exhibits inert behavior during the deposition method in accordance with method step (d) is affixed to the substrate as the thermal radiation absorption layer.

6. The method according to claim 1, in which a material or a material mixture which is compatible with a material and/or a contact-connecting process of an electrical contact that is to be applied later, is affixed to the substrate as the thermal radiation absorption layer.

7. The method according to claim 1, in which the thermal radiation absorption layer is affixed to the substrate by means of sputtering in accordance with method step (b).

8. The method according to claim 1, in which a doped Si layer, is used as the thermal radiation absorption layer.

9. The method according to claim 8, in which the Si layer is affixed to the substrate with a thickness which lies between 10 nm and 20 µm inclusive.

10. The method according to claim 8, in which the Si layer has a doping of at least $1\times10^{19}/cm^3$.

11. The method according to claim 1, in which the heating in accordance with method step (c) is essentially effected by means of thermal radiation.

12. The method according to claim 1, in which, in method step (c), a heating source is used which generates thermal radiation of a spectral range for which the thermal radiation absorption layer exhibits good radiation absorption.

13. The method according to claim 1, in which a non-metallic layer is used as the thermal radiation absorption layer.

* * * * *